(12) United States Patent
Lee

(10) Patent No.: US 6,708,506 B2
(45) Date of Patent: Mar. 23, 2004

(54) DISPLAY APPARATUS FOR REFRIGERATOR

(75) Inventor: Dae-Gui Lee, Changwon (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/320,670

(22) Filed: Dec. 17, 2002

(65) Prior Publication Data

US 2003/0110784 A1 Jun. 19, 2003

(30) Foreign Application Priority Data

Dec. 19, 2001 (KR) .................................. 10-2001-0081469

(51) Int. Cl.[7] ................................................ F25B 49/00
(52) U.S. Cl. ............................. 62/125; 62/298; 345/82; 340/815.45; 374/170
(58) Field of Search .......................... 62/125, 126, 127, 62/129, 130, 298; 236/94; 165/11.1; 374/170; 340/584, 585, 588, 589, 815.45; 345/46, 82

(56) References Cited

U.S. PATENT DOCUMENTS

| | | | |
|---|---|---|---|
| 4,114,447 A | * 9/1978 | Creach | 374/170 |
| 4,545,210 A | * 10/1985 | Lord | 62/77 |
| 4,929,936 A | * 5/1990 | Friedman et al. | 340/815.45 |
| 4,966,004 A | * 10/1990 | Midlang et al. | 62/298 |
| 5,623,836 A | * 4/1997 | Mrozinsky et al. | 62/298 |
| 5,990,802 A | * 11/1999 | Maskeny | 345/82 |
| 6,101,819 A | * 8/2000 | Onaka et al. | 62/125 |

* cited by examiner

Primary Examiner—Harry B. Tanner
(74) Attorney, Agent, or Firm—Fleshner & Kim, LLP

(57) ABSTRACT

The present invention relates to a display apparatus for a refrigerator. In the present invention, the display apparatus is constructed by using a single-sided board 30 with circuit patterns 32 formed on one side thereof. The single-sided board 30 is formed with through-holes 33 through which jumper wires 34 pass so as to connect circuit patterns spaced far apart from one another among the circuit patterns 32. Remaining portions of the jumper wires 34 except the portions thereof connected to the circuit patterns 32 are disposed on a side of the board with no circuit patterns formed thereon. Light-emitting devices 40 are mounted on the single-sided board 30 so that the circuit patterns 32 and leads 42 of the light-emitting devices are electrically connected with one another. The light-emitting devices 40 receive electrical signals through the circuit patterns 32 by means of the electrical connection of the leads 42 with the circuit patterns 32, and selectively emit light so as to display information. According to the present invention, there are advantages in that production costs are decreased, the assembly work is simplified, a defective proportion is reduced, and durability of the display apparatus is improved.

5 Claims, 3 Drawing Sheets

DISPLAY APPARATUS FOR REFRIGERATOR

BACKGROUND OF THE INVENTION

1. Field of the Invention

The present invention relates to a refrigerator, and more particularly, to a display apparatus installed on an outer surface of a refrigerator to display information on operations of the refrigerator.

2. Description of the Prior Art

FIG. 1 shows the outer constitution of a general refrigerator. As shown in the figure, a freezing chamber and a refrigerating chamber are provided as storage spaces to be open forward within a main body 1 of the refrigerator. Generally, the freezing chamber is provided above the refrigerating chamber. The freezing and refrigerating chambers can be selectively opened by doors 3, 5 for the freezing and refrigerating chambers, respectively. The doors 3, 5 are provided with handles 3', 5' to facilitate opening and closing of the doors 3, 5, respectively.

A dispenser 7 may be provided on a front surface of the door 5 to be exposed to the outside. The dispenser 7 allows a user to drink water through the interior of the refrigerator without opening the door 5.

Meanwhile, a display unit 10 is installed on a side of a front surface of the door 3. The display unit 10 is a unit for displaying a variety of information on the operating status or operations of the refrigerator.

The inner constitution of such a display unit 10 is well shown in FIG. 2. As shown in this figure, a double-sided board 12 is formed with circuit patterns 14 on opposite sides thereof. Light-emitting devices 15 such as LEDs are mounted on the circuit patterns 14. The light-emitting devices 15 are arranged in various configurations to indicate a variety of information. For example, Arabic numerals can be indicated by combining seven light-emitting devices 15 that emit light in a bar shape.

The light-emitting devices 15 are seated on the double-sided board 12 and emit light when a predetermined voltage is applied thereto through the circuit patterns 14 formed on the double-sided board 12. Such light-emitting devices 15 are seated on the circuit patterns 14 and then electrically connected to adjacent circuit patterns 14 through wires 16 in order to receive the predetermined voltage. Several dozens of light-emitting devices 15 are generally used for forming one display unit 10.

Further, the double-sided board 12 is mounted on a frame 18 constituting the display unit 10. A cover 19 is provided in the front of the frame 18 so that only light emitted from the light-emitting devices 15 can be seen from the outside.

However, there are problems in the prior art as follows.

Since the double-sided board 12 is formed with the circuit patterns 14 on both the opposite sides thereof, there is a problem in that production costs of the board are relatively high.

Meanwhile, since the wires 16 are used for electrical connection with light-emitting devices 15, there is another problem in that wire bonding portions of the light-emitting devices 15 and circuit patterns 14 to which the wires 16 are bonded should be plated with gold in order to enhance bondability of the wires.

Moreover, since the wires 16 are used for electrical connection between the light-emitting devices 15 and the circuit devices 14, there is a further problem in that a large number of wires 16 are utilized and thus a failure due to wire breakage frequently occurs while or after the wire bonding operation is performed.

SUMMARY OF THE INVENTION

The present invention is contemplated to solve the problems in the prior art. An object of the present invention is to provide a relatively simple display apparatus.

Another object of the present invention is to provide a display apparatus of which manufacturing process is relatively simplified and a fraction defective is lowered.

According to an aspect of the present invention for achieving the above objects, there is provided a display apparatus for a refrigerator, comprising a single-sided board with circuit patterns formed only on one side thereof; a plurality of light-emitting devices which are mounted on the one side of the single-sided board and of which leads are connected with the circuit patterns to receive electrical signals and to selectively emit light; and jumper wires for electrically connecting the circuit patterns with one another in such a manner that both ends of each of the jumper wires are connected with the circuit patterns and an intermediate portion thereof is disposed on a side opposite to the one side with the circuit patterns formed thereon by penetrating through the single-sided board.

The jumper wires may make electrical connection between the circuit patterns which form circuits separate from one another.

The single-sided board may be formed with a plurality of through-holes so that the jumper wires penetrate through the single-sided board.

The light-emitting devices may be mounted on the side with the circuit patterns formed thereon.

Preferably, the single-sided board is mounted on a frame, and a cover is installed on the frame so that only light emitted from the light-emitting devices can be viewed from the outside.

The display apparatus for the refrigerator according to the present invention constructed as such has advantages in that production costs are reduced, the manufacturing process is simplified, and the fraction defective is minimized.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENTS

Hereinafter, a preferred embodiment of a display apparatus for a refrigerator according to the present invention will be described in detail with reference to the accompanying drawings.

Figure 1:
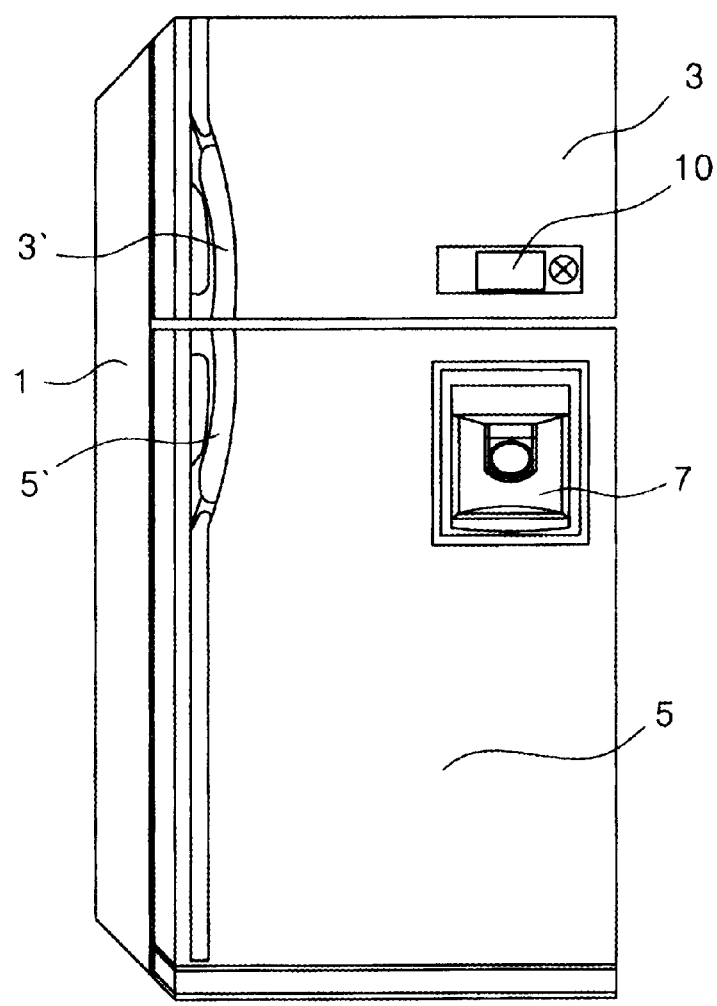
FIG. 1 is a perspective view of a general refrigerator.
Figure 2:
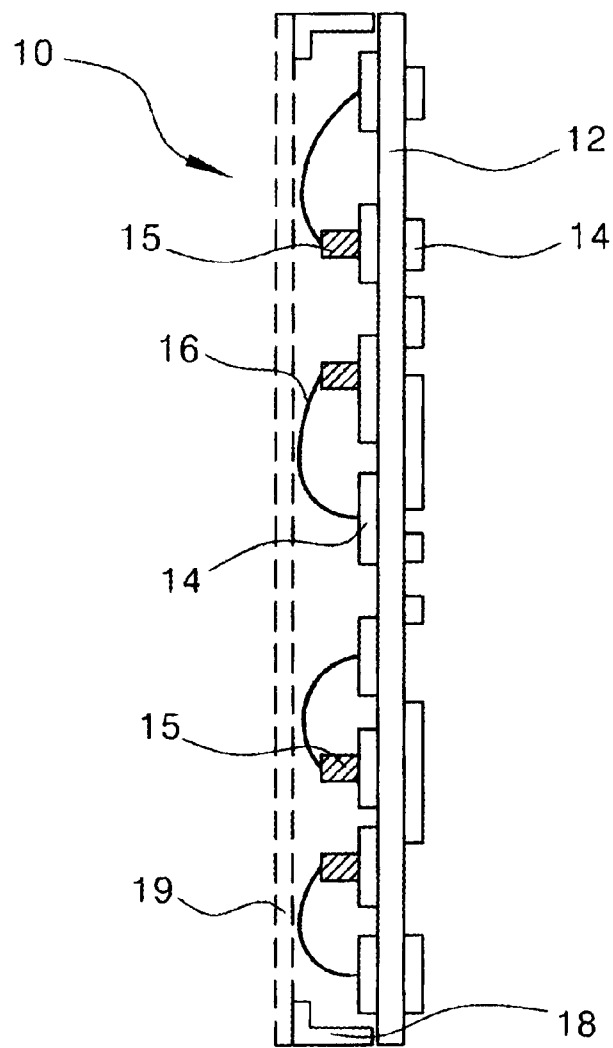
FIG. 2 is a sectional view showing the constitution of a major portion of a conventional display apparatus for the refrigerator.
Figure 3:
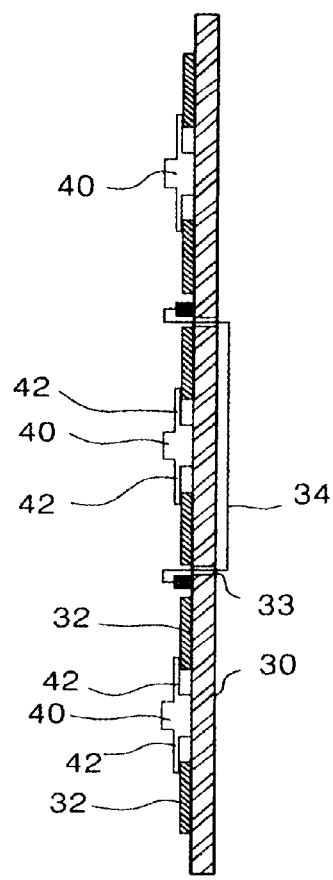
FIG. 3 is a sectional view showing the constitution of a preferred embodiment of a display apparatus for a refrigerator according to the present invention.
Figure 4:
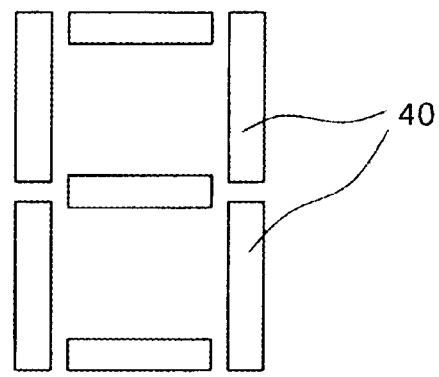
FIG. 4 is a front view illustrating an example of a number indicated by light-emitting devices in the embodiment of the present invention.

FIG. 3 shows a sectional view of the preferred embodiment of the display apparatus for the refrigerator according to the present invention, and FIG. 4 shows a front view illustrating an example of a number indicated by light-emitting devices in the embodiment of the present invention.

As shown in these figures, a single-sided board 30 is employed in the display apparatus of the present invention. The single-sided board 30 is formed to take a shape of a plate with a predetermined area and has circuit patterns 32 formed only on a single side thereof. The circuit patterns 32 themselves constitute one circuit, or serve to make connection between separate devices or between devices and circuits.

A plurality of through-holes 33 are formed through the single-sided board 30. The through-holes 33 are formed to penetrate through the side of the board with the circuit patterns 32 formed thereon and an opposite side of the board without such circuit patterns. Jumper wires 34 pass through the through-holes 33. Ends of the jumper wires 34 are connected to the circuit patterns 32. Therefore, each of the jumper wires 34 connects the circuit patterns 32, which constitute one circuit, with each other so that the circuit patterns 32 formed on the single-sided board 30 can be electrically connected with one another as originally designed.

If the respective circuit patterns 32 are to be connected with one another by using additional circuit patterns 32 rather than the jumper wires 34, an area of the single-sided board 30 required for the connection is increased and thus the display apparatus is excessively enlarged. To prevent this enlargement, the jumper wires 34 function to connects the circuit patterns 32 with one another that are spaced far apart from one another but required to be connected with one another.

Particularly, the jumper wires 34 are arranged such that a major portion thereof is caused to penetrate through the single-sided board 30 and be disposed on a side of the board with no circuit patterns formed thereon. Since such jumper wires 34 with diameters of about 0.5 mm are generally used, there is almost no risk of wire breakage.

Meanwhile, a plurality of light-emitting devices 40 are mounted on the side of the single sided-board 30 with the circuit patterns 32 formed thereon. The light-emitting devices 40 emit light when a voltage beyond a predetermined value is applied thereto. For example, the light-emitting devices 40 can display necessary information in such a manner that they are arranged to cause a number to be displayed as shown in FIG. 4 when viewed from the front thereof or light is caused to be emitted in a circular shape from each of the light-emitting devices 40.

Each of the light-emitting devices 40 is formed integrally with a plurality of leads 42. The leads 42 are used for electrical connection of the light-emitting device with the outside. Herein, the leads are electrically connected with the circuit patterns 32. The light-emitting devices 40 are mounted on the single-sided board 30 by soldering the leads 42 onto the circuit patterns 32.

For reference, the single-sided board 30 is mounted on a frame 50 which in turn is installed at a front surface of a door of the refrigerator. The frame 50 may be formed integrally with or separately from the front surface of the door.

A cover 60 for shielding front faces of the light-emitting devices 40 is installed on the frame 50 so that only the light emitted from the light-emitting devices 40 can be viewed from the outside. The cover 60 causes the circuit patterns 32 or light-emitting devices 40 to be protected against and not to be exposed to an external environment. An additional coating film may be attached to a front surface of the cover 60.

Next, an operation of the display apparatus for the refrigerator according to the present invention constructed as such will be described.

The single-sided board 30 with the circuit patterns 32 formed only on one side thereof is employed in the display apparatus of the present invention. The light-emitting devices 40 are mounted on the single-sided board 30. The jumper wires 34 are used in order to relatively reduce the size of the display apparatus even while employing the single-sided board 30 with the circuit patterns 32 formed only on one side thereof.

The jumper wires 34 are used for electrical connection of the circuit patterns 32 with one another that are spaced far apart from one another and required to be electrically connected with one another. With the use of the jumper wires 34, there is no need for additional circuit patterns for connecting the circuit patterns 32 to be electrically connected with one another. Thus, the area on which the circuit patterns are formed can be minimized.

Further, the light-emitting devices 40 are mounted on the single-sided board 30 by soldering the leads 42 onto the circuit patterns 32 to be electrically connected therewith. Therefore, it is not necessary to plate the circuit patterns 32, which are to be connected with the leads 42, with gold. Accordingly, the light-emitting devices 40 and the circuit patterns 32 can be simply and firmly connected with one another.

In particular, since the leads 42 and the circuit patterns 32 are connected with one another through relatively large areas, no connection failure occurs. Once they are connected with one another, breaking of connection never occurs and thus no failure occurs in use.

Since the leads 42 of the light-emitting devices 40 are soldered onto the circuit patterns 32 in such a way, the side of the single-sided board 30 with the circuit patterns 32 formed thereon is relatively less complicated in its configuration.

Of course, although the jumper wires 34 are used, a major portion of the jumper wires 34 is disposed on a side opposite to the side with the circuit patterns 32 formed thereon. Further, since the diameters of the jumper wires 34 are as large as about 0.5 mm, there is no risk of wire breakage.

According to the display apparatus for the refrigerator of the present invention described in detail above, the single-sided board can be utilized even while making the connection between the circuit patterns by using the jumper wires Thus, there is an advantage in that the production costs of the board are greatly reduced.

Further, since the light-emitting devices are mounted on the single-sided board by soldering the leads onto the circuit patterns, it is not necessary to plate the circuit patterns with gold. Thus, there are advantages in that the number of processes is decreased and material costs are greatly reduced.

Moreover, since the light-emitting devices are mounted on the single-sided board by soldering the leads onto the circuit patterns, the electrical connection therebetween can be firmly made. Once the leads are connected with the circuit patterns, the connections among them are not broken. Thus, there are advantages in that a fraction defective of the assembly work is greatly reduced and durability of the display apparatus is largely improved.

It will be apparent that those skilled in the art can make various modifications within the scope of the technical sprit of the invention. Further, the present invention should be construed based on the appended claims.

What is claimed is:

1. A display apparatus for a refrigerator, comprising:
   a single-sided board with circuit patterns formed only on one side thereof;
   a plurality of light-emitting devices which are mounted on the one side of the single-sided board and of which leads are connected with the circuit patterns to receive electrical signals and to selectively emit light; and
   jumper wires for electrically connecting the circuit patterns with one another in such a manner that both ends of each of the jumper wires are connected with the circuit patterns and an intermediate portion thereof is disposed on a side opposite to the one side with the circuit patterns formed thereon by penetrating through the single-sided board.

2. The display apparatus as claimed in claim 1, wherein the jumper wires make electrical connection between the circuit patterns which form circuits separate from one another.

3. The display apparatus as claimed in claim 1, wherein the single-sided board is formed with a plurality of through-holes so that the jumper wires penetrate through the single-sided board.

4. The display apparatus as claimed in claim 1, wherein the light-emitting devices are mounted on the side with the circuit patterns formed thereon.

5. The display apparatus as claimed in claim 1, wherein the single-sided board is mounted on a frame, and a cover is installed on the frame so that only light emitted from the light-emitting devices can be viewed from the outside.

* * * * *